(12) United States Patent
Oh et al.

(10) Patent No.: US 7,434,018 B2
(45) Date of Patent: Oct. 7, 2008

(54) MEMORY SYSTEM

(75) Inventors: Jong-Hoon Oh, Chapel Hill, NC (US); Ralf Schedel, Starnberg (DE)

(73) Assignee: Infineon Technologies North America Corp., San Jose, CA (US)

( * ) Notice: Subject to any disclaimer, the term of this patent is extended or adjusted under 35 U.S.C. 154(b) by 120 days.

(21) Appl. No.: 11/495,689

(22) Filed: Jul. 31, 2006

(65) Prior Publication Data

US 2008/0025128 A1   Jan. 31, 2008

(51) Int. Cl.
*G06F 12/00* (2006.01)

(52) U.S. Cl. .................. 711/167; 711/154

(58) Field of Classification Search ............ 711/167, 711/154, 105, 5; 710/3, 310
See application file for complete search history.

(56) References Cited

U.S. PATENT DOCUMENTS

| | | | |
|---|---|---|---|
| 6,366,989 B1 * | 4/2002 | Keskar et al. | 711/167 |
| 7,007,130 B1 * | 2/2006 | Holman | 711/5 |
| 2002/0141238 A1 * | 10/2002 | Pasternak | 365/185.11 |

* cited by examiner

*Primary Examiner*—Vu A Le
(74) *Attorney, Agent, or Firm*—Posz Law Group, PLC

(57) ABSTRACT

A device or method for activating a memory, which includes receiving a select signal at the memory, receiving a plurality of address bits at the memory, determining whether the select signal is active, determining whether a first bit in the plurality of address bits has a first value, and activating the memory only if the select is active and the first bit has the first value.

24 Claims, 5 Drawing Sheets

700

MEMORY SYSTEM

BACKGROUND OF THE INVENTION

In semiconductor devices that store random access data, a memory controller is typically provided to coordinate the writing and reading of that data to and from a memory device. This memory controller coordinates when the memory device will be active, when it will be written to, when it will be read from, and what specific memory elements (i.e., bit storage elements) within the memory will be accessed.

In dynamic random access memories (DRAMs), especially synchronous DRAMs (SDRAM, double data rate (DDR) SDRAM, mobile SDRAM, mobile DDR SDRAM, etc.), or the like, each memory chip receives a signal that indicates whether the memory element will be active or not. This signal is typically called a chip select (CS) signal. It is set to have a first value (e.g., low or logical "0") when the memory chip (or memory die) is to be active, and is set to have a second value (e.g., high or logical "1") when the memory element is to be inactive. Generally a memory element will be kept inactive except when it is being actively accessed for a read or a write operation.

As semiconductor devices continue to increase in speed and complexity, their need for larger amounts of memory (i.e. memory density) likewise increases. In some devices a single large memory chip can be used to obtain a desired memory size. In other devices multiple smaller memory chips can be used in place of a single large memory die. The smaller memory chips can cost less to manufacture than larger devices, such that two memory chips of a given size can cost less than a single larger memory chip of a corresponding memory size. The single larger memory chip can also be too big to fit into the given package size which typically follows the value set by a standard so that it's realization can be delayed until the next advanced technology is available.

When multiple smaller memory chips are used to achieve a desired memory size, however, it is necessary to provide a separate chip select signal for each individual memory chip. This is because only one memory chip should be activated at any given time. Since each memory chip is a separate memory device in its own right, each must be selected by its own respective chip select line.

As a result, when multiple memory chips are used to achieve a desired memory size, a memory controller must generate a number of chip select signals equal to the number of memory chips used. And because a chip select signal is not generally multiplexed on a line, the memory controller must have a separate output pin for each chip select signal.

SUMMARY OF THE INVENTION

A device or method for activating a memory in a memory device, which includes receiving a select signal at the memory, receiving a plurality of address bits at the memory, determining whether the select signal is active, determining whether a first bit in the plurality of address bits has a first value, and activating the memory only if the select is active and the first bit has the first value

BRIEF DESCRIPTION OF THE DRAWINGS

The accompanying figures where like reference numerals refer to identical or functionally similar elements and which together with the detailed description below are incorporated in and form part of the specification, serve to further illustrate an exemplary embodiment and to explain various principles and advantages in accordance with the present invention.

DETAILED DESCRIPTION

It is understood that the use of relational terms such as first and second, and the like, if any, are used solely to distinguish one from another entity, item, or action without necessarily requiring or implying any actual such relationship or order between such entities, items or actions. It is noted that some embodiments can include a plurality of processes or steps, which can be performed in any order, unless expressly and necessarily limited to a particular order; i.e., processes or steps that are not so limited can be performed in any order.

In addition, reference is made throughout to "high" and "low" bit values or bit values of "1" and "0." For purposes of explanation a high reference voltage is used to represent a high or "1" bit value and a low reference voltage or ground voltage is used to represent a low or "0" bit value, and many circuit elements are triggered by one or the other bit value. It should be understood that particular voltages could be changed and that the operation of disclosed elements based on particular bit values could be switched around between high and low.

Much of the inventive functionality and many of the inventive principles when implemented, can be supported with or in integrated circuits (ICs), such as dynamic random access memory (DRAM) devices or the like. In particular, they can be implemented using CMOS transistors. It is expected that one of ordinary skill, notwithstanding possibly significant effort and many design choices motivated by, for example, available time, current technology, and economic considerations, when guided by the concepts and principles disclosed herein will be readily capable of generating such ICs with minimal experimentation. Therefore, in the interest of brevity and minimization of any risk of obscuring the principles and concepts according to the present invention, further discussion of such ICs will be limited to the essentials with respect to the principles and concepts used by the exemplary embodiments. In one embodiment a memory device can be provided that includes multiple memories that operate functionally as a single memory. In other words, the multiple-chip (or multiple-die) memory device is operated using the same signals and connections that would be used to operate a single-chip memory device. One embodiment of this is a dual-die package (DDP) including two memory chips (i.e., two memory dies) in a single memory device package. In another embodiment, multiple memories are arranged on multiple dies or on a single die. In another embodiment, multiple memories are arranged in multiple packages.

Figure 1:
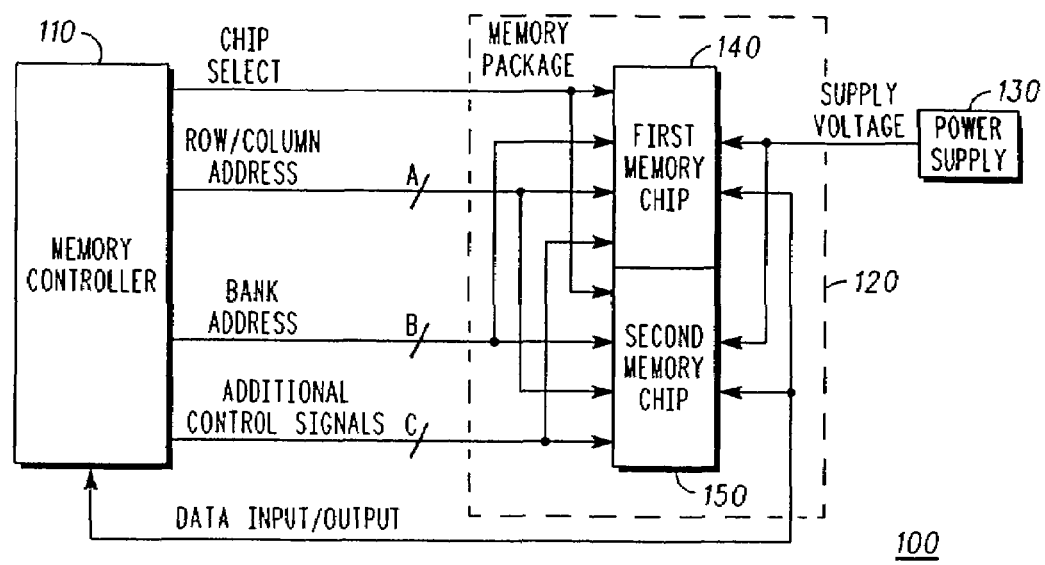
FIG. 1 is a diagram of a dual die package memory device according to an embodiment.

FIG. 1 is a diagram of a DDP memory device according to one embodiment. As shown in FIG. 1, the memory device 100 includes a memory controller 110, a memory package 120, and a power supply 130. The memory package 120 further includes a first memory chip 140 and second memory chip 150. Each of these memory chips 140, 150 is formed on a separate die and has its own set of input and output lines.

The memory controller 110 controls the operation of the memory package 120. It provides the necessary address and control signals to the memory package 120 to properly access the memory cells (or elements) in the memory package 120 for reading and writing data. It also provides a data input/output connection to read data from the memory package 120 and write data to the memory package 120.

The power supply 130 provides the necessary supply voltage connections to the memory package 120. This can include a positive supply voltage $V_{DD}$, a negative supply voltage $V_{SS}$, or a ground voltage $V_{GND}$. Although not shown, the power supply 130 can also be connected to the memory controller 110.

The first and second memory chips 140 and 150 each store bits of data in a known fashion. They can be any suitable kind of memory device, e.g., a SDRAM, DDR SDRAM, or the like. They are both connected to the same data input/output line, but are generally not accessed for a read or write operation at the same time.

Although in the disclosed embodiment the memory package 120 includes two memory chips 140 and 150 of the same size, this is only by way of example. In alternate embodiments the memory package 120 can include a larger number of memory chips. And the relative size of the different memory chips can vary.

Exemplary address and control connections provided by the memory controller 110 include a chip select (CS) line for passing a chip select signal, a set of A address lines for passing row and column addresses for selecting memory elements in the first and second memory chips 140 and 150, a set of B bank address lines for passing a bank address identifying individual memory banks within the first and second memory chips 140 and 150, and C additional control signals, as needed. The additional control signals can include a write enable (WE) signal, a column address select (CAS) signal, a row address select (RAS) signal, or any other sort of control signal required for the operation of the memory package 120.

In this embodiment the address lines, control lines, and data input/output lines are each connected to the memory package 120 at a single point. The memory package 120 then splits the signal lines to provide each memory chip 140, 150 with a copy of the signals provided on these lines. By having a single set of input lines the memory package 120 can appear as if it were using a single memory chip containing the entirety of the available memory. This can also keep the number of input/output lines required by the memory package 120 relatively low compared to other multiple-chip packages. In alternate embodiments, however, some or all of the signal lines could be split prior to connecting to the memory package 120. In this case, the memory package 120 could have separate input/output lines for some signals going to certain memory chips.

The various address lines (row, column, and bank) are used to identify specific memory locations in the memory package 120. As a result, there must be a total number of address lines sufficient to address all of the memory elements. Since the memory chips 140 and 150 that form the memory package 120 are smaller than the total available memory, they individually have fewer memory locations and can be addressed by fewer address bits. For example, if the total memory in the memory package 120 is split between two memory chips 140 and 150 of equal size, then each individually can be addressed by one fewer address bit than would be required for the entire memory package 120. The additional address bit can be used to determine which of the two memory chips 140 and 150 to activate, and the remaining address bits determine one or more locations where the selected memory chip 140 or 150 should be accessed.

Given that the memory package 120 is simulating a single memory chip using two smaller memory chips, it does not need to receive multiple chip select signals. Rather it receives a single chip select signal, but one additional address bit. The placement of the address bit determines the functional shape of the simulated memory. If the address bit is a bank address bit, then the memory package 120 will functionally have eight banks each of the same size as the banks in the memory chips 140 and 150; if the address bit is a row address bit, then the memory package 120 will functionally have four banks each with the same number of columns but twice the number of rows as the banks in the memory chips 140 and 150; and if the address bit is a column address bit, then the memory package 120 will functionally have four banks each with the same number of rows but twice the number of columns as the banks in the memory chips 140 and 150.

The memory chips 140 and 150 can use the chip select signal to determine whether it needs to activate one of the first or second memory chip 140 or 150, and can use the additional address bit as an activation bit to determine which of the two memory chips 140 and 150 to activate. The remaining address bits can then be used to access an address on the selected memory chip 140 or 150.

Although FIG. 1 discloses a dual die package memory device, this embodiment should not be limited to dual die devices. Its concepts are equally applicable to embodiments in which more than two memory dies are used to simulate a larger single memory die. As embodiments include larger numbers of memory dies, it will be necessary to provide additional selection bits. This can be in the form of additional chip select lines, additional address bits used as activation bits, or any other suitable way of providing an appropriate number of activation bits.

Figure 2:
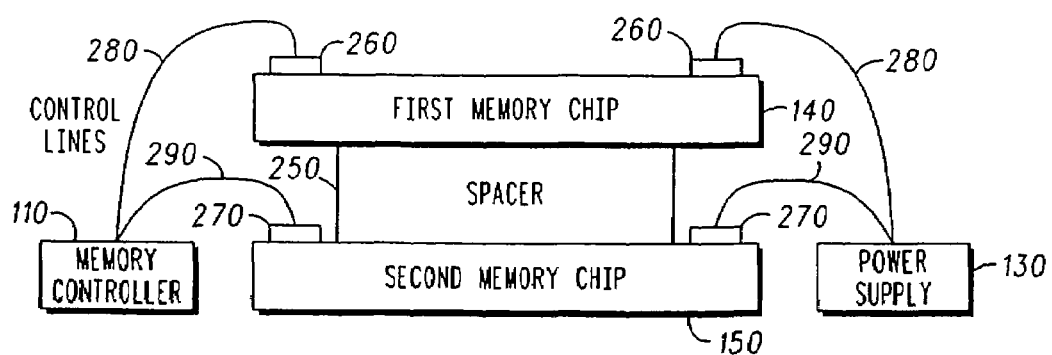
FIG. 2 is a diagram of a physical configuration of the memory device of FIG. 1 according to an embodiment.

FIG. 2 is a diagram of a physical configuration of the memory device of FIG. 1 according to a disclosed embodiment. As shown in FIG. 2, this configuration involves connecting the first and second memory chips 140 and 150 on either side of a spacer 250. The spacer 250 can be made of an insulating material such that the first and second chips 140 and 150 are electrically isolated from each other.

The first memory chip 140 is connected to the memory controller 110 and the power supply 130 through first connection lines 280 and first die pads 260 on the first memory chip 140. The second memory chip 150 is connected to the memory controller 110 and the power supply 130 through second connection lines 290 and second die pads 270 on the second memory chip 150

Although in FIG. 2 the first and second memory chips 140 and 150 are shown as being formed on opposite sides of the spacer 250, this is by way of example only. In alternate embodiments the two memory chips 140 and 150 could be arranged in other manners. For example, the two memory chips 140 and 150 could be formed side by side on a single integrated circuit board, or they could be arranged in any other desirable configuration.

In one particular embodiment, the memory chips 140 and 150 are 512 megabit synchronous DRAM memory chips, which when added together provide a 1 gigabit DRAM memory package.

Figure 3:
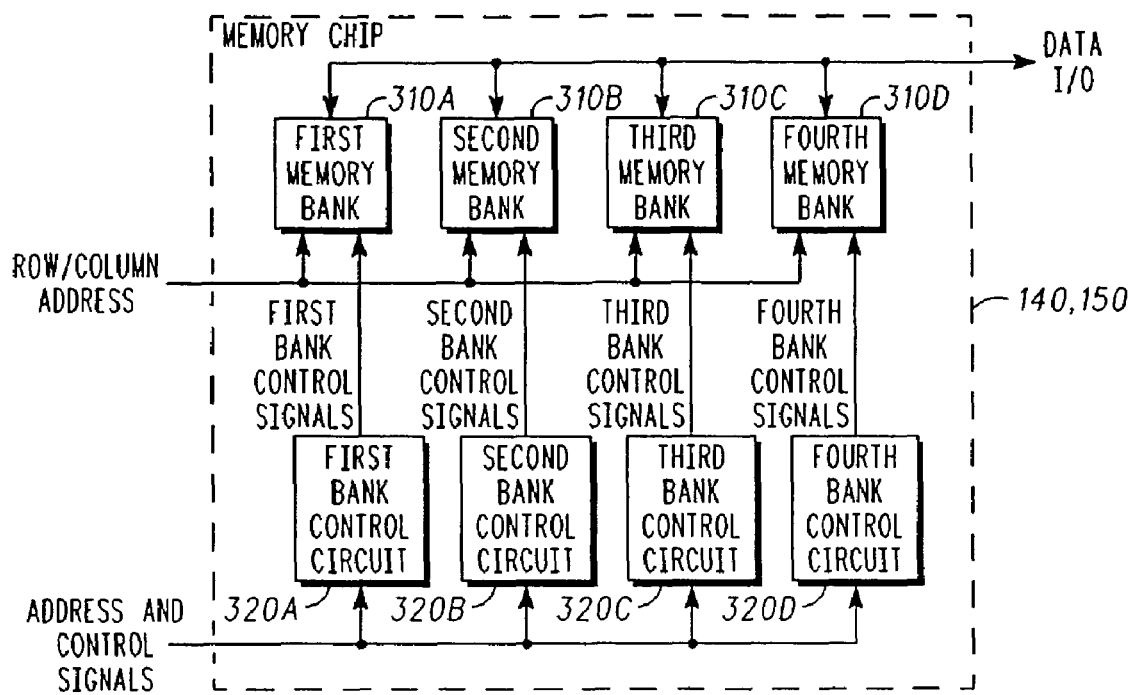
FIG. 3 is a diagram of a memory unit of FIG. 1 according to an embodiment.

FIG. 3 is a diagram of a memory chip of FIG. 1 according to a disclosed embodiment. This diagram could apply to either the first or second memory chip 140 or 150 of FIG. 3.

As shown in FIG. 3, the memory chip 140, 150 includes a first memory bank 310A, a second memory bank 310B, a third memory bank 310C, a fourth memory bank 310D, a first bank control circuit 320A, a second bank control circuit 320B, a third bank control circuit 320C, and a fourth bank control circuit 320D. For ease of disclosure, an exemplary memory bank can be referred to simply by the reference number 310, and an exemplary bank control circuit can be referred to simply by the reference number 320

The first through fourth memory banks 310A, 310B, 310C, and 310D each contain one quarter of the memory elements in the memory chip. Data bits can be read out of or written into the memory banks 310A, 310B, 310C, and 310D through the data input/output (I/O) line, based on row/column address signals received from the memory controller 110 and bank control signals received from a respective one of the first through fourth bank control circuits 320A, 320B, 320C, and 320D. The particular details of how a memory bank would be arranged to store bits of data would be well known to one skilled in the art of memory design.

The first through fourth bank control circuits 320A, 320B, 320C, and 320D receive address and control signals generated by the memory controller 110 (e.g., chip select signal, a portion of the row/column address as an activation bit, a bank address, and additional control signals), and generate bank control signals to direct the operation of the memory banks 310A, 310B, 310C, and 310D.

Although a single kind of memory chip is shown for both the first and second memory chips 140 and 150, this is simply shown by way of example. In alternate embodiments the organization and size of the two chips could be implemented differently, with a corresponding change in their respective bank control circuitries.

In addition, although FIG. 3 shows separate first through fourth bank control circuits 320A, 320B, 320C, and 320D for the first through fourth memory banks 310A, 310B, 310C, and 310D, respectively, it is not absolutely necessary for there to be an equal number of banks and control circuits. In alternate embodiments a single bank control circuit could control the operation of all of the memory banks. Likewise, various bank control functions could be split up or combined in different control circuits as needed.

Figure 4:
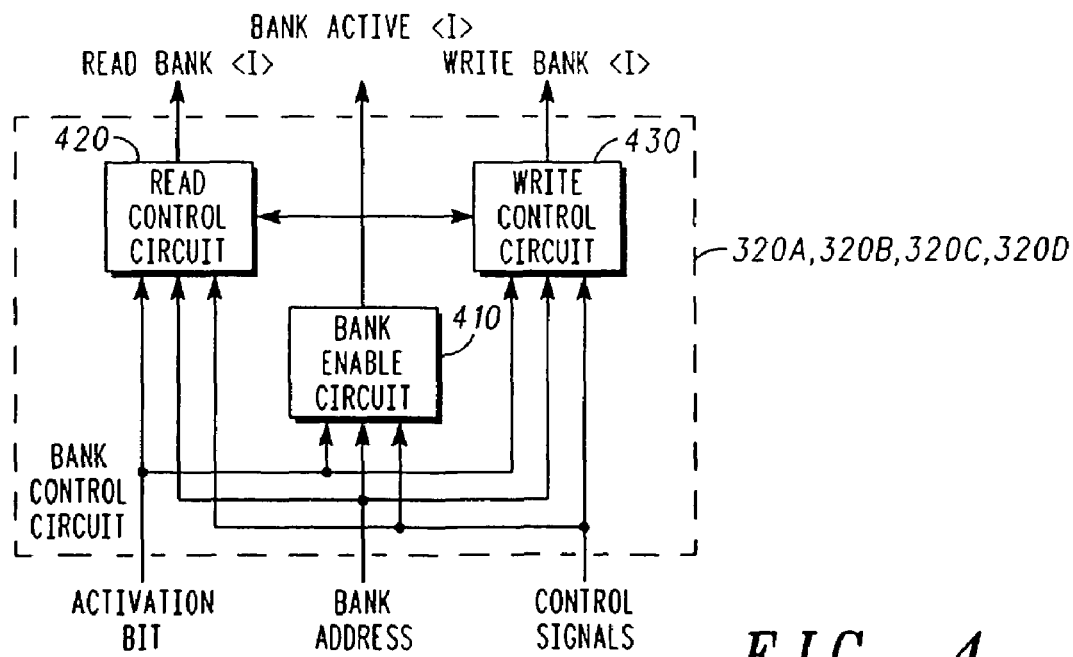
FIG. 4 is a diagram of a bank control circuit of FIG. 3 according to an embodiment.

FIG. 4 is a diagram of one embodiment of a bank control circuit of FIG. 3 according to a disclosed embodiment. As shown in FIG. 4, each of the bank control circuits 320A, 320B, 320C, 320D includes a bank enable circuit 410, a read control circuit 420, and a write control circuit 430.

The bank enable circuit 410 receives an activation bit, a bank address, and at least some of the control signals, and generates a bank active <i> signal that indicates whether an $i^{th}$ bank is to be activated. In this case i is an index value referring to the available memory banks.

In an embodiment in which a separate bank control circuit is provided for each memory bank, each bank control circuit generates a bank active <i> signal for its corresponding memory bank. For example, a first bank control circuit 320A controlling the operation of a first memory bank 310A could generate a bank active <1> signal (i.e., a first bank active signal) that instructs the first memory bank 310A as to whether it is active or not.

In an embodiment in which a single bank control circuit controls the operation of multiple memory banks, the memory bank control circuit would generate an appropriate number of bank active <i> signals. For example, a single bank control circuit controlling the operation of first, second, and third memory banks could generate a bank active <1> signal, a bank active <2> signal, and bank active <3> signal, that instructs first, second, and third memory banks, respectively, as to whether each is active or not.

The read control circuit 420 receives the activation bit and at least some of the control signals and generates a read bank <i> signal that indicates whether an $i^{th}$ bank is to have data read from it. Similarly, the write control circuit 430 receives the activation bit and at least some of the control signals and generates a write bank <i> signal that indicates whether an $i^{th}$ bank is to be have data written to it.

The bank enable circuit 410, the read control circuit 420, and the write control circuit 430 in FIG. 4 are all shown as being connected to control signals. This represents some or all of the control signals that are provided by the memory controller 110. In various embodiments different groups of the available control signals could all be connected to the same set of control signals, or they could each be connected to an appropriate set of control signals required for their operation.

As noted above, in this embodiment the activation bit is one of the address bits. It can be part of the row address, part of the column address, or part of the bank address. In alternate embodiments an activation bit separate from the address data could be provided to the bank control circuit.

Figure 5:
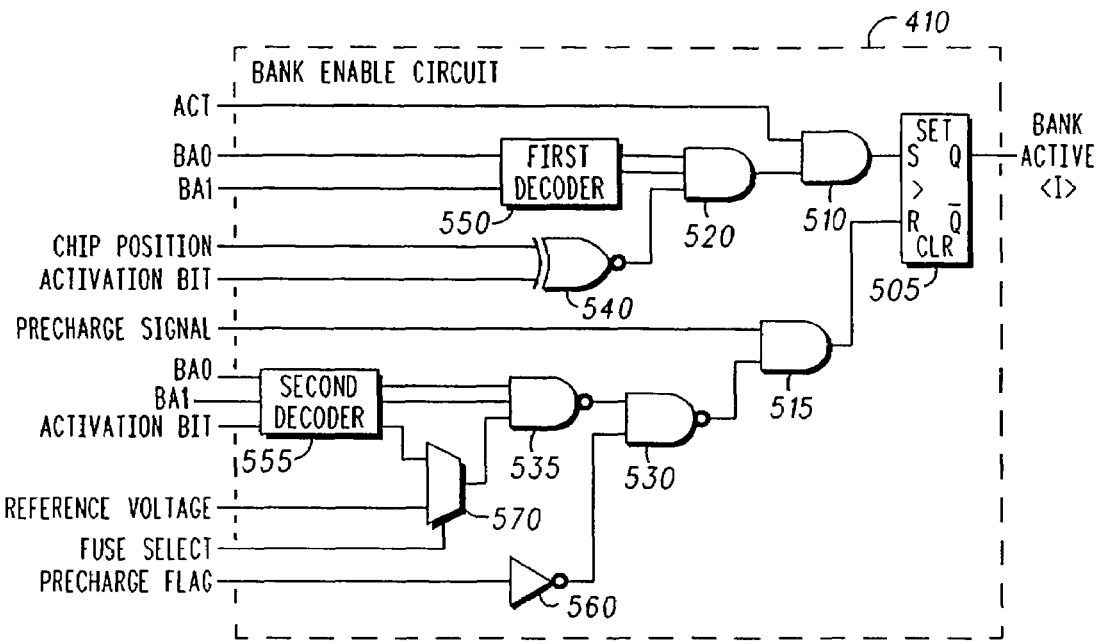
FIG. 5 is a diagram of the bank enable circuit of FIG. 4 according to an embodiment.

FIG. 5 is a diagram of the bank enable circuit of FIG. 4 according to a disclosed embodiment. As shown in FIG. 5, the bank enable circuit 410 includes a flip-flop 505, a first AND gate 510, a second AND gate 515, a third AND gate 520, a first NAND gate 530, a second NAND gate 535, an XOR gate 540, a first decoder 550, a second decoder 555, an inverter 560, and a fuse multiplexer 570.

The first decoder 550 accepts the first bank address bit (BA0) and the second bank address bit (BA1), and outputs decoded values of these inputs that each have a high value when the respective input line is equivalent to a corresponding value in a two-bit bank address for the memory bank associated with the bank enable circuit. If a three-bit bank address is used, the first decoder 550 will use the first two bits of the three-bit address. For example, if the two-bit bank address for the associated memory bank was "10" (or the first two bits of an associated three-bit bank address was "10"), the first decoder 550 would output a decoded BA0 signal of high value if BA0 had a value of "1", and would output a decoded BA1 signal high value if BA1 had a value of "0".

The XOR gate 540 accepts a chip position signal and the activation bit and outputs a high value when the chip position signal and the activation bit have the same value. The chip position signal is a signal that indicates which position the memory chip 140, 150 holds in the memory package 120 (i.e., is it a first memory chip 140 or a second memory chip 150). In the disclosed embodiment in which two memory chips are used 140 and 150, one chip position is represented by a high value and the other chip position is represented by a low value. This can be achieved by simply connecting a chip position line in each memory chip to a proper voltage in the power supply 130.

The activation bit selects a memory chip 140, 150 based on the chip position signal for that chip. In other words, when the activation bit has a high value, it selects the memory chip with a chip position signal of high value. And when the activation bit has a low value, it selects the memory chip with a chip position signal of low value.

In this way, the output of the XOR gate 540 indicates whether the memory chip containing the memory bank associated with current bank enable circuit 410 is a selected chip.

It will have a high value when the current chip is selected and a low value when the current chip is not selected.

The third AND gate 520 receives the decoded BA0, the decoded BA1 from the first decoder 550, and the output of the XOR gate 540, and outputs a high value only when all three of these values are also high. In other words, the third AND 520 gate outputs a high value only when a two-bit bank address (or the first two bits of a three-bit bank address) corresponds to the current bank, and the activation bit indicates that the current memory chip has been selected.

The first AND gate 510 receives as its inputs the output of the third AND gate 520 and an activation command that indicates whether a memory operation should be performed. It outputs a high value only when these two input signals are both also high. In other words, the first AND gate 510 outputs a high value only when a two-bit bank address (or the first two bits of a three-bit bank address) corresponds to the current bank, the activation bit indicates that the current memory chip has been selected, and the active command indicates that a memory operation is to be performed. The active command essentially reflects the chip select signal, since both are indicative of whether the memory package 120 should be activated to be accessed for a memory operation. In various embodiments the active command can be received directly from the memory controller 110, or it can be derived by the memory chip 140, 150 or the bank control circuit 320 based on the control signals received from the memory controller 110.

Although the first and third AND gates 510 and 520 are shown as two separate elements, in alternate embodiments they could be formed as a single AND gate with four inputs (i.e., the decoded BA0, the decoded BA1, the output of the XOR gate 540, and the active command).

The second decoder 555 accepts a first bank address bit (BA0), a second bank address bit (BA1), and the activation bit, and outputs decoded values of these inputs that each have a high value when the respective input line is equivalent to a corresponding value in a three-bit bank address for the memory bank associated with the bank enable circuit. For example, if the three-bit bank address for the associated memory bank was 101, the second decoder would output a decoded BA0 of high value if BA0 had a value of "1", would output a decoded BA1 of high value if BA1 had a value of "0", and would output a decoded activation bit of high value if the activation bit had a value of "1".

The fuse multiplexer 570 accepts an active reference voltage (e.g., $V_{DD}$) and the decoded activation bit and outputs one of these input signals based on the value of a fuse select signal. In this embodiment the value of the fuse select signal is determined based on whether the decoded activation bit is a bit from the row address or a bit from the bank address. If the activation bit is a bit from the row address, the fuse select signal is set to choose the reference voltage input; if the activation bit is a bit from the bank address, the fuse select signal is set to choose the decoded activation bit input.

Thus, if the activation bit is a bit from the row address, the output of the fuse multiplexer 570 will be a constant high value, and if the activation bit is a bit from the bank address (i.e., it is equal to BA2), the output of the fuse multiplexer will be will be equal to the decoded activation bit (i.e., the decoded BA2).

The fuse select signal is set at the memory chip 140, 150, e.g., by connecting a pin at the memory chip 140, 150 to a fixed reference voltage. It should be set to one value and remain constant throughout operation of the memory package 120.

In alternate embodiments the fuse multiplexer can be replaced with a physical fuse that is set for the device during manufacture (e.g., using laser fusing). In such embodiments the fuse can be left intact to connect to one of the reference voltage or the activation bit, and can be cut to connect to the other of the reference voltage or the activation bit.

The inverter 560 inverts a precharge flag to generate an inverted precharge flag signal. This is used by the bank enable circuit to help determine when a precharge operation is required to all banks being activated previously instead of precharging only one bank select by the bank address. In some embodiments the precharge flag can be one of the row/column address bits.

The second NAND gate 535 receives the decoded BA0, the decoded BA1, and the output of the fuse multiplexer as its input, and outputs a low value only when all three of these values are high. When the bank address is three bits long (and the decoded BA2 from the fuse multiplexer 570 is connected to the second NAND gate 535), this output will only be low when the three-bit bank address matches the bank address of the current memory bank. Likewise when the bank address is two bits long (and the constant high value from the fuse multiplexer is connected to the second NAND gate 535), this output will only be low when the two-bit bank address matches the bank address of the current memory bank.

The first NAND gate 530 receives the output of the second NAND gate 535 and the inverted precharge flag as inputs and outputs a low value only when both of these input values are high.

The second AND gate 515 receives as inputs the output of the first NAND gate 530 and a precharge signal indicating whether a precharge operation should be performed. It outputs a high value only when these two input values are also high.

The flip-flop 505 receives the output of the first AND 510 gate as its set value (S), receives the output of the second AND gate 515 as its reset value (R), and generates the bank active <i> signal as its output (Q). The flip-flop 505 thus outputs a high bank active <i> signal when the current memory bank is selected for a memory operation. Because of the operation of the fuse multiplexer 570, the bank enable circuit 410 will also reset when a precharge operation is required.

In some embodiments the activation bit input line and the chip position line on each memory chip can be connected to a reference voltage (e.g., ground) through an internal pull-up or pull-down transistor circuit. This will allow for a default value for each of these signals, allowing these input lines to be left unconnected in situations where the activation bit or the chip position signal can remain at that default value throughout operation.

The precharge flag and activation command can be provided directly by the memory decoder 110, or can be generated based on other control signals received from the memory decoder. For example, the precharge flag and activation command could be derived from some combination of the chip select signal, a row address select signal, a column address select signal, and a write enable signal.

Although the embodiment of FIG. 5 describes an embodiment in which the activation bit can be one of a bit form the row address and a bit from the bank address, alternate embodiments can use different values for the activation bit. In such cases the bank enable circuit should be adjusted accordingly such that the bank active <i> signal will properly control the associated memory bank or banks.

The first and second decoders can 550 and 555 be implemented as a lookup tables, appropriate arrangements of inverters, or the like. The two decoders 550 and 555 could be formed as the same circuit or different circuits.

Figure 6:
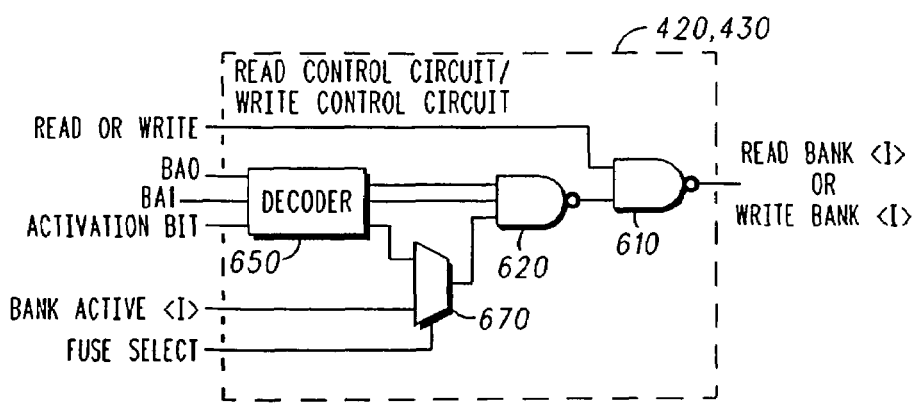
FIG. 6 is a diagram of the read control circuit and the write control circuit of FIG. 4 according to an embodiment.

FIG. 6 is a diagram of the read control circuit and the write control circuit of FIG. 4 according to one disclosed embodiment. The read control circuit 420/write control circuit 430 each include a first AND gate 610, a second AND gate 620, a decoder 650, and a fuse multiplexer 670.

The decoder 650 accepts a first bank address bit (BA0), a second bank address bit (BA1), and the activation bit, and outputs decoded values of these inputs that each have a high value when the respective input line is equivalent to a corresponding value in a three-bit bank address for the memory bank associated with the bank enable circuit. For example, if the three-bit bank address for the associated memory bank was 101, the second decoder would output a decoded BA0 of high value if BA0 had a value of "1", would output a decoded BA1 of high value if BA1 had a value of "0", and would output a decoded activation bit of high value if the activation bit had a value of "1".

The fuse multiplexer 670 accepts the bank active <i> signal and the decoded activation bit and outputs one of these input signals based on the value of a fuse select signal. In this embodiment the value of the fuse select signal is determined based on whether the decoded activation bit is a bit from the row address or a bit from the bank address. If the activation bit is a bit from the row address, the fuse select signal is set to choose the bank active <i>; if the activation bit is a bit from the bank address, the fuse select signal is set to choose the decoded activation bit input.

Thus, if the activation bit is a bit from the row address, the output of the fuse multiplexer 670 will be equal to the bank active <i> signal, and if the activation bit is a bit from the bank address (i.e., it is equal to BA2), the output of the fuse multiplexer will be will be equal to the decoded activation bit (i.e., the decoded BA2).

The fuse select signal is set at the memory chip 140, 150, e.g., by connecting a pin at the memory chip 140, 150 to a fixed reference voltage. It should be set to one value and remain constant throughout operation of the memory package 120.

In alternate embodiments the fuse multiplexer 670 can be replaced with a physical fuse that is set for the device during manufacture (e.g., using laser fusing). In such embodiments the fuse can be left intact to connect to one of the reference voltage or the activation bit, and can be cut to connect to the other of the reference voltage or the activation bit.

The second AND gate 620 receives the decoded BA0, the decoded BA0, and the output of the fuse multiplexer 670 as its input, and outputs a high value only when all three of these values are high. When the bank address is three bits long (and the decoded BA2 from the fuse multiplexer 670 is connected to the second AND gate 620), this output will only be high when the three-bit bank address matches the bank address of the current memory bank. Likewise when the bank address is two bits long (and the bank enable <i> signal from the fuse multiplexer 670 is connected to the second AND gate 620), this output will only be high when the two-bit bank address matches the bank address of the current memory bank and the current memory bank (and thus the current chip) is active.

The first AND gate 610 receives as its input the output of the second AND gate 620 and either a read command or a write command, depending upon the type of circuit. A read control circuit 420 will receive a read command; and a write control circuit 430 will receive a write command. The read command will be high when a read operation is to be performed, while the write command will be high when a write operation is to be performed.

The first AND gate 610 generates a read bank <i> signal for a read control circuit 420 and a write bank <i> signal for a write control circuit 430. These output signals will only have a high value when both the output of the second AND gate 620 and the read or write command are both high. In other words, the read control circuit 420 will only output a high read bank <i> signal when the current memory bank is selected and the read command indicates that a read operation should be performed. Likewise, the write control circuit 430 will only output a high write bank <i> signal when the current memory bank is selected and the write command indicates that a write operation should be performed.

The read command and the write command can be provided directly by the memory decoder 110, or can be generated based on other control signals received from the memory decoder. For example, the read command and the write command could be derived from some combination of the chip select signal, a row address select signal, a column address select signal, and a write enable signal.

Figure 7:
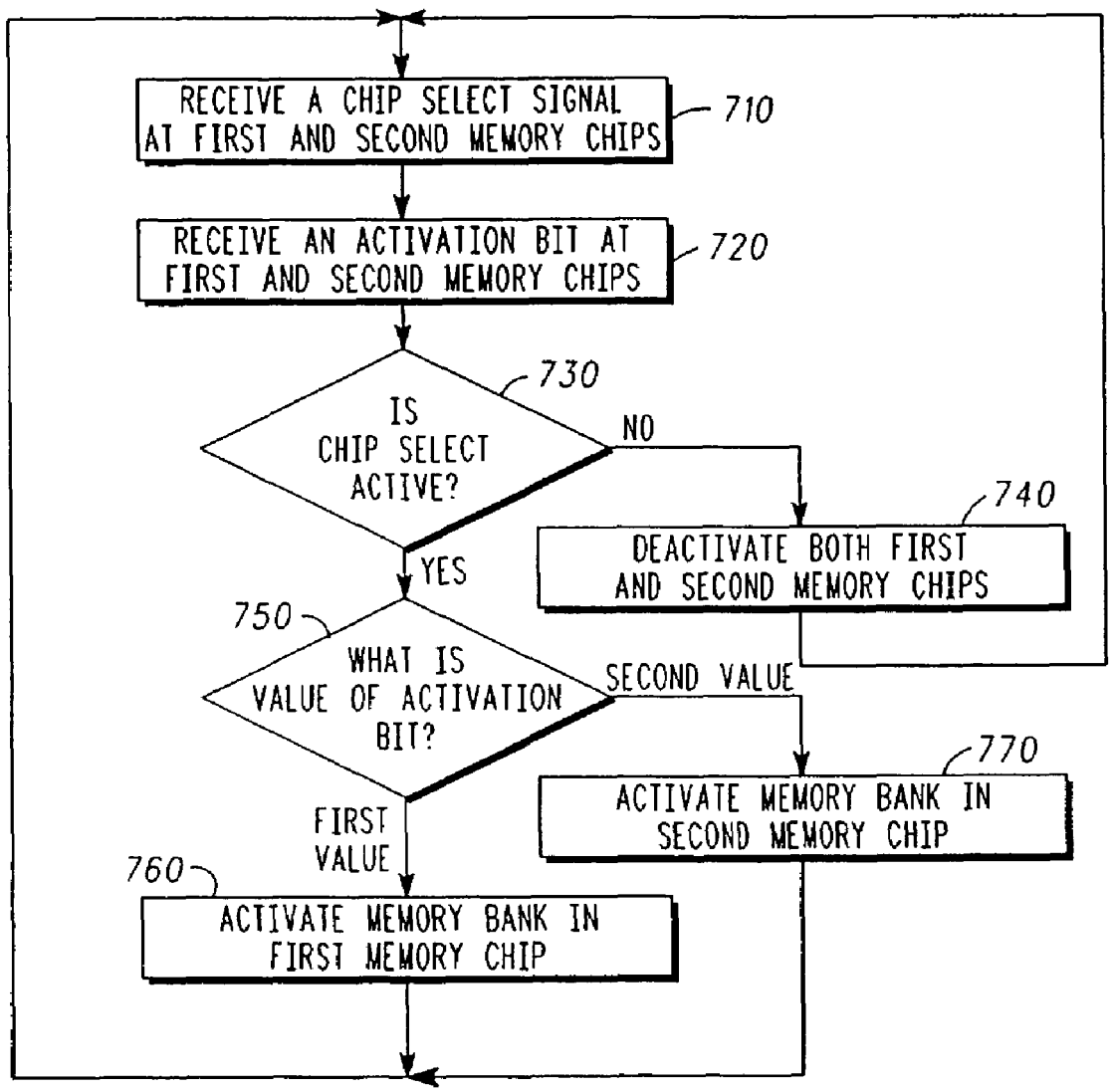
FIG. 7 is a flow chart of a method of controlling a memory system according to an embodiment.

FIG. 7 is a flow chart of a method of controlling a dual die memory package according to an embodiment of the invention. As shown in FIG. 7, the method 700 begins when the memory package 120 receives a chip select (CS) signal from the memory controller 110 (710). The chip select signal has an active value (e.g., a high value) when data is to be read from or written to the memory package 120, and has an inactive value (e.g., a low value) when no data is to be read from or written to the memory package 120.

The first and second memory chips 140 and 150 in the memory package 120 also receives an activation bit (720). This activation bit indicates which of the first and second memory chips 140 and 150 should be accessed for a memory operation (e.g., read or write). In various embodiments the activation bit can be selected as a bit from the row address, a bit from the column address, a bit from the bank address, or some other appropriate identifying bit.

The memory package 120 will then determine whether the chip select signal is active or not (730). This can be performed individually in the first and second memory chips 140 and 150, or in a separate circuit on the memory package 120. This can involve directly monitoring the chip select signal or monitoring a value derived from the chip select signal.

If the chip select signal is not active, the memory package 120 deactivates both of the first and second memory chips 140 and 150 (740). This operation can be performed individually in the first and second memory units 140 and 150 (e.g., in a bank control circuit 320), or in a separate circuit on a memory chip 140, 150 or on the memory package 120 in general.

If, however, the chip select signal is active, the memory package 120 determines what value the activation bit has (750). If it has a first value, the memory package 120 activates an appropriate memory bank in the first memory chip 140 (760); if it has a second value, the memory package 120 activates an appropriate memory bank in the second memory chip 150 (770). The particular memory bank to be activated and the memory location on the memory bank to be accessed will depend on the values of the various row, column, and bank address bits.

Regardless of whether a memory bank is activated (760, 770) or not (740), the memory package 120 will continue to receive the chip select signal (710) and the activation bit (720), and act accordingly based on their values.

Although a particular order of operation is shown in FIG. 7, this is by way of example only. As long as activation (760, 770) only occurs after a determination is made that the chip select signal is active, and the activation bit is appropriate to the activated memory unit 140 or 150, the operations can be performed in any order desired.

Figure 8:
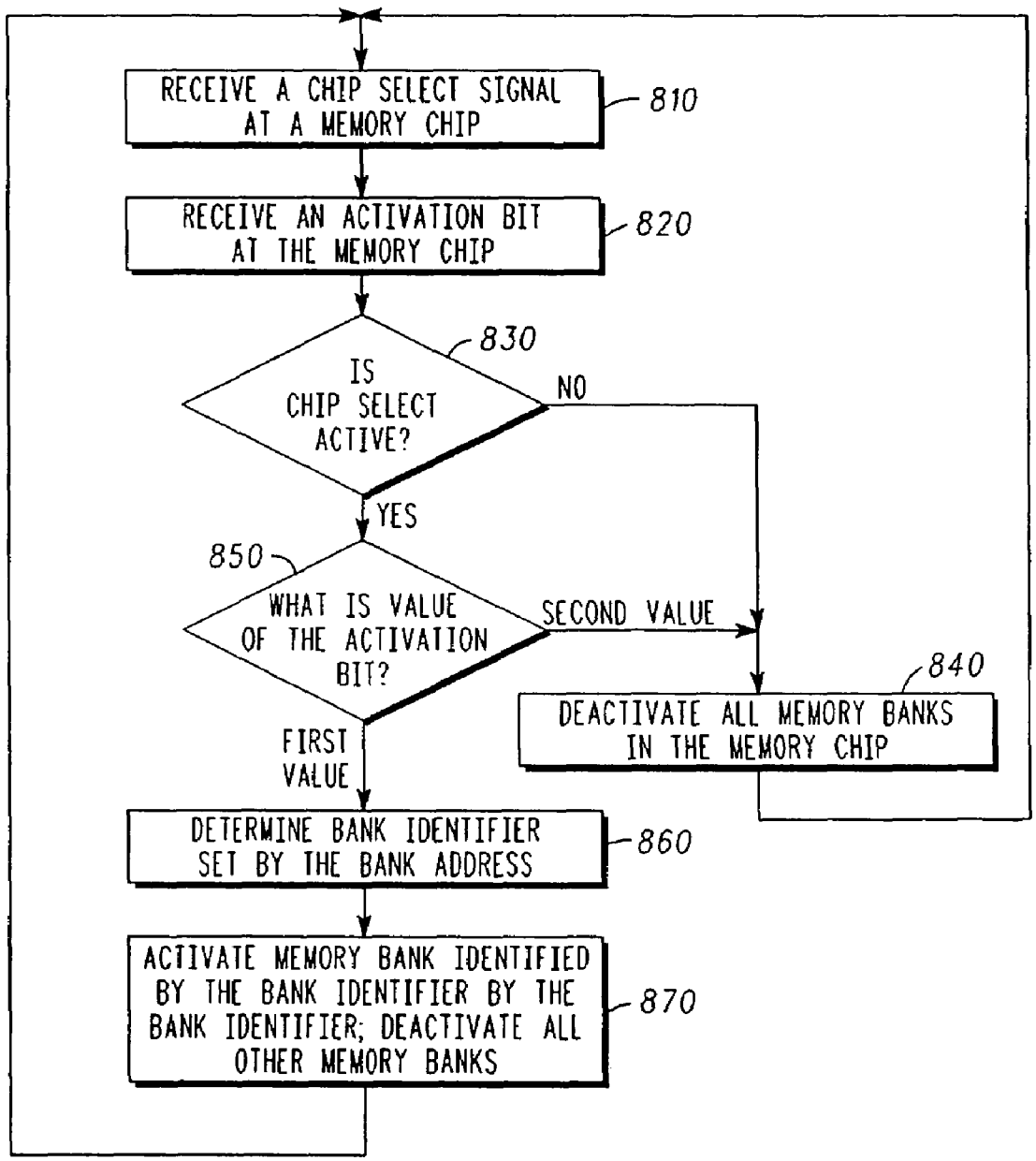
FIG. 8 is a flow chart of a method of controlling a memory according to an embodiment.

In addition, although the method of FIG. 7 discloses a decision between only two memory banks, this too is only for ease of disclosure. In alternate embodiments more address bits can be considered to make a determination as to which of a larger number of memory banks FIG. 8 is a flow chart of a method of controlling a memory chip according to an embodiment of the invention. By way of example, this method will be described with respect to the first memory chip 140. However it will be understood that this is for illustrative purposes only, and that it could easily be performed at the second memory chip 150 or other memory chips in embodiments that employ more than two memory chips in a memory package 120.

As shown in FIG. 8, the method 800 begins when the first memory chip 140 receives a chip select (CS) signal from the memory controller 110 (810). The chip select signal has an active value when data is to be read from or written to the memory package 120, and has an inactive value when no data is to be read from or written to the memory package 120.

The first memory chip 140 also receives an activation bit (820). This activation bit indicates which of the first and second memory chips 140 and 150 should be accessed for a memory operation (e.g., read or write). In various embodiments the activation bit can selected as a bit from the row address, a bit from the column address, a bit form the bank address, or some other appropriate identifying bit.

The first memory chip 140 will then determine whether the chip select signal is active or not (830). This operation can be performed individually in the bank control circuits 320, or in a separate circuit on the first memory chip 140. This can involve directly monitoring the chip select signal or monitoring a value derived from the chip select signal.

If the chip select signal is not active, the first memory chip 140 deactivates all of the memory banks 310 in the first memory chip 140 (840). This operation can be performed individually in the bank control circuits 320, or in a separate circuit on the first memory chip 140.

If the chip select signal is active, the first memory chip 140 determines what value the activation bit has (850). If the activation bit has a second value that corresponds to the second memory chip 150, the first memory chip 140 will deactivate all memory banks 310 on the first memory chip 140. (840)

If the activation bit has a first value that corresponds to the first memory chip 140, then the first memory chip 140 determines a bank identifier based on some or all of the bank address (860). If the bank address is two bits, the first memory chip 140 will use the entire bank address for this purpose. If the bank address is three bits, the first memory chip 140 will use the first two bits of the bank address for this purpose, the third bit of the bank address having already been used as the activation bit.

Once the bank identifier has been determined (860), the first memory chip 140 will activate the memory bank in the first memory chip 140 that is identified by the bank identifier and will deactivate all other memory banks on the first memory chip 140 (870).

Regardless of whether a memory bank is activated (870) or not (840), the first memory chip 140 will continue to receive the chip select signal (810) and the activation bit (820), and act accordingly based on their values.

Although a particular order of operation is shown in FIG. 8, this is by way of example only. As long as activation (870) only occurs after a determination is made that the chip select signal is active and the activation bit is appropriate to the activated memory unit 140 or 150, the operations can be performed in any order desired.

As noted above, the disclosed embodiments use the chip select signal, the activation bit, the chip position bit to determine which of the two memory chips 140 and 150 in the memory package at a given time. TABLE 1 shows when the first memory chip 140 will be in an active mode, when the first memory chip 140 will be in a standby mode, when the second memory chip 150 will be in an active mode, and when the second memory chip 150 will be in a standby mode.

TABLE 1

|  | Chip Select | Activation Bit | Chip Position Bit | State |
|---|---|---|---|---|
| First Memory Chip | 0 | 0 | 0 | Active |
|  | 0 | 1 | 0 | Standby |
|  | 1 | X | 0 |  |
| Second Memory Chip | 0 | 1 | 1 | Active |
|  | 0 | 0 | 1 | Standby |
|  | 1 | X | 1 |  |

As shown by TABLE 1, the chip select signal determines whether one of the memory chips 140 or 150 will be active, and the activation bit further determines which of the memory chips 140 or 150 it will be.

Although TABLE 1 describes an embodiment using two chips in a dual-die package, it can be extended to packages including a larger number of chips. In such embodiments the larger number of chips could be selected by including additional chip select signals or additional activation bits, or some combination of the two.

This disclosure is intended to explain how to fashion and use various embodiments in accordance with the invention rather than to limit the true, intended, and fair scope and spirit thereof. The foregoing description is not intended to be exhaustive or to limit the invention to the precise form disclosed. Modifications or variations are possible in light of the above teachings. The embodiment(s) was chosen and described to provide the best illustration of the principles of the invention and its practical application, and to enable one of ordinary skill in the art to utilize the invention in various embodiments and with various modifications as are suited to the particular use contemplated. All such modifications and variations are within the scope of the invention as determined by the appended claims, as may be amended during the pendency of this application for patent, and all equivalents thereof, when interpreted in accordance with the breadth to which they are fairly, legally, and equitably entitled. The various circuits described above can be implemented in discrete circuits or integrated circuits, as desired by implementation.

What is claimed is:

1. A semiconductor memory device, comprising:
  a first memory configured to store a first plurality of data bits;
  a second memory configured to store a second plurality of data bits; and
  a memory controller configured to receive a select signal and a plurality of address bits, and to control operation of the first and second memories,
  wherein the memory controller activates the first memory only when the select signal is active and when an activation bit selected from the plurality of address bits has a first value, and activates the second memory only when the select signal is active and when the activation bit has a second value.

2. The semiconductor memory of claim 1, further comprising:
a third memory configured to store a third plurality of data bits,
wherein the memory controller circuit activates the first memory only when the select signal is active, when the activation bit has the first value, and when an address selected from the plurality of address bits matches a first identifier, and activates the third memory only when the select signal is active, when the activation bit has the first value, and when the address matches a third identifier.

3. The semiconductor memory of claim 1, wherein the memory controller comprises:
a first memory control circuit configured to receive the select signal and the plurality of address bits, and to control operation of the first memory; and
a second memory control circuit configured to receive the select signal and the plurality of address bits, and to control operation of the second memory,
wherein the first memory control circuit activates the first memory only when the select signal is active and when the activation bit has a first value, and
wherein the second memory control circuit activates the second memory only when the select signal is active and when the activation bit has a second value.

4. The semiconductor memory of claim 1, wherein the activation bit is received at the memory controller at the same time as the address is received.

5. The semiconductor memory of claim 1, wherein the activation bit is received at the memory controller at the same time as one of a row address or a column address selected from the plurality of address bits is received.

6. The semiconductor memory of claim 1, wherein the first value corresponds to an active voltage and the second value corresponds to an inactive voltage.

7. A method of operating a semiconductor memory, comprising:
receiving a select signal at a first memory; and a second memory;
receiving an address bit at the first memory; and at the second memory;
determining whether the select signal is active;
determining whether the address bit has a first value or a second value; and
accessing the first memory only when the select signal is active and the address bit has the first value, and the second memory only when the select signal is active and the address bit has the second value.

8. The method of claim 7, wherein the address bit is one of a bank address bit and a row address bit.

9. The method of claim 7, wherein the accessing of the first memory comprises one of reading data from the first memory or writing data to the first memory.

10. The method of claim 7, wherein the first value is one of a positive reference voltage and a ground voltage.

11. A memory activation circuit, comprising:
a comparison circuit configured to receive a reference voltage and an activation identifier bit, and to output a first intermediate signal indicating whether a value of the activation identifier bit is equal to the reference voltage;
a decoder configured to receive an address, and to output a second intermediate signal indicating whether the address matches an identifier; and
a memory activation circuit configured to receive the first and second intermediate signals and to generate an activation signal, the activation signal indicating that the memory should be activated only when the first intermediate signal indicates that the value of the activation identifier bit is equal to the reference voltage and the second intermediate signal indicates that the address matches the identifier.

12. The memory activation circuit of claim 11, wherein the comparison circuit comprises an exclusive OR gate.

13. The memory activation circuit of claim 11, wherein the memory activation circuit comprises:
an AND gate configured to receive the first and second intermediate signals and to generate a third intermediate signal; and
a flip-flop configured to receive the third intermediate signal and to generate the activation signal.

14. The memory activation circuit of claim 11, wherein the activation bit is received at the comparison circuit at the same time as the address is received at the decoder.

15. The memory activation circuit of claim 11, wherein the activation bit is received at the comparison circuit at the same time as one of a row address or a column address selected from the plurality of address bits is received at the memory activation circuit.

16. A memory activation circuit, comprising:
means for comparing a reference voltage and an activation identifier bit, and outputting a first intermediate signal indicating whether a value of the activation identifier bit is equal to the reference voltage;
means for decoding an address and outputting a second intermediate signal indicating whether the address matches an identifier; and
means for generating an activation signal, the activation signal indicating that the memory should be activated only when the first intermediate signal indicates that the value of the activation identifier bit is equal to the reference voltage and the second intermediate signal indicates that the address matches the identifier.

17. The memory activation circuit of claim 16, wherein the means for comparing comprises a means for performing an exclusive OR operation.

18. The memory activation circuit of claim 16, wherein the means for generating an activation signal comprises:
means for performing an AND operation on the first and second intermediate signals, and to generate a third intermediate signal; and
means for generating the activation signal based on the third intermediate signal.

19. The memory activation circuit of claim 16, wherein the activation bit is received at the means for comparing at the same time as the address is received at the means for decoding.

20. The memory activation circuit of claim 16, wherein the activation bit is received at the means for comparing at the same time as one of a row address or a column address selected from the plurality of address bits is received at the means for generating a k activation signal.

21. A method of activating one of at least two memory banks in a memory chip, including:
receiving a chip select signal at the memory chip;
receiving a plurality of address bits at the memory chip;
determining whether the chip select signal is active;
determining whether a first bit in the plurality of address bits has a first value or a second value; and
activating a first memory bank only if the chip select is active and the first bit has the first value, and a second memory bank only if the chip select is active and the first bit has the second value.

22. The method of claim 21, further comprising:
    determining whether a bit sequence selected from the plurality of address bits matches a bank identifier,
    wherein the activating of the memory bank occurs only if the bit sequence matches the bank identifier.

23. The method of claim 21, wherein the first value is one of an active voltage and an inactive voltage.

24. The method of claim 23, wherein the active voltage is a positive reference voltage, and the inactive voltage is a ground voltage.

* * * * *